United States Patent [19]

Ozawa et al.

[11] Patent Number: 4,838,707
[45] Date of Patent: Jun. 13, 1989

[54] ELECTRONIC THERMOMETER

[75] Inventors: Masaki Ozawa; Toshiyuki Hosaka, both of Shiojiri; Masayuki Yoshizawa, Suwa, all of Japan

[73] Assignees: Shiojiri Kogyo Kabushiki Kaisha, Nagano; Kabushiki Kaisha Suwa Seikosha, Tokyo, both of Japan

[21] Appl. No.: 77,086

[22] Filed: Jul. 17, 1987

Related U.S. Application Data

[63] Continuation of Ser. No. 696,385, Jan. 30, 1985, abandoned.

[30] Foreign Application Priority Data

Feb. 1, 1984 [JP] Japan ................... 59-17499
Sep. 13, 1984 [JP] Japan ................... 59-202778

[51] Int. Cl.$^4$ .............................................. G01K 7/24
[52] U.S. Cl. ................................. 374/171; 374/170; 377/25
[58] Field of Search ................. 374/170–173, 374/179, 181, 183, 185; 377/25; 128/736

[56] References Cited

U.S. PATENT DOCUMENTS

| | | | |
|---|---|---|---|
| 3,875,503 | 4/1975 | Hayashi | 324/62 |
| 4,050,309 | 9/1977 | Junkert et al. | 374/171 |
| 4,117,722 | 10/1978 | Helmstetter | 374/171 |
| 4,130,019 | 12/1978 | Nitschke | 73/341 |
| 4,150,573 | 4/1979 | Iinuma et al. | 374/171 |
| 4,176,556 | 12/1979 | Takenaka | 374/171 |
| 4,210,024 | 7/1980 | Ishiwatari et al. | 73/362.5 |
| 4,214,234 | 7/1980 | Cunningham, Jr. et al. | 340/347 AD |
| 4,298,947 | 11/1981 | Tamura et al. | 364/557 |
| 4,423,968 | 1/1984 | Nemcek, Sr. et al. | 374/170 |
| 4,453,834 | 6/1984 | Suzuki et al. | 368/201 |
| 4,464,067 | 8/1984 | Hanaoka | 374/170 |
| 4,471,354 | 9/1984 | Smith | 374/183 |
| 4,559,954 | 12/1985 | Murase | 374/171 |

FOREIGN PATENT DOCUMENTS

| | | | |
|---|---|---|---|
| 158427 | 1/1983 | Fed. Rep. of Germany | 374/171 |
| 40677 | 3/1979 | Japan | 374/171 |
| 161627 | 10/1982 | Japan | 374/171 |
| 2144226 | 2/1985 | United Kingdom | 374/171 |

Primary Examiner—Allan N. Shoap
Assistant Examiner—W. Morris Worth
Attorney, Agent, or Firm—Blum Kaplan

[57] ABSTRACT

An electronic thermometer is provided in which the number of pulses counted in a first count and the number of pulses counted in a second count are respectively proportional to the resistance of a reference resistance and that of a thermosensing element. When the first counted value is to be adjusted so as to realize the absolute value adjustment of the thermometer, the difference between the resistance of the thermosensing element and the resistance of the reference resistor is adjusted by varying the number of counts in a counter upon whose content the timing of the second count depends. Accordingly, the absolute value precision adjustment of the electronic thermometer is realized by providing an initial logic adjustment circuit in which the number of the first clock counts is appropriately varied.

23 Claims, 6 Drawing Sheets

ELECTRONIC THERMOMETER

This is a continuation of Application Ser. No. 696,385 filed Jan. 30, 1985 abandoned.

BACKGROUND OF THE INVENTION

This invention relates to electronic thermometers. More particularly, the invention relates to the absolute value precision adjustment of an electronic thermometer.

It is known, in electronic thermometers in which a thermosensing element and a reference resistor are used, to improve the accuracy of the temperature measurement by providing for adjustment of the absolute value of the reference resistance relative to the thermosensing element at the time of the adjustment. To this end, the reference resistor is connected in series with a variable resistor and the difference between the resistance of the thermosensing element and that of the reference is compensated for by adjusting the variable resistor.

In thermometers of the type just described, the compensating adjustments take a long time to complete, the realization of a highly precise, absolute value adjustment is difficult, and, because of the the required expensive variable resistor and the many steps required in manufacturing, the electronic thermometer is costly.

SUMMARY OF THE INVENTION

In accordance with the present invention, a precision adjustment of the absolute value of an element for sensing a quantity to be measured and the reference element in a measuring device of the type described above is realized by an initial logic adjustment circuit which compensate for difference between a quantitative value of a physical property of the sensing element dependent on the quantity being measured and a quantitative value of the reference element at the time of manufacture, and correcting the measured quantity at the time of measurement. The difference is compensated by setting an appropriate number of counts into a counter which is used in performing the actual quantity measurement.

In an illustrative electronic thermometer fabricated in accordance with the present invention, the number of pulses counted in a first count and the number of pulses counted in a second count are respectively proportional to the resistance of a reference resistance and that of a thermosensing element. When the first counted value is to be adjusted so as to realize the absolute value adjustment of the thermometer, the difference between the resistance of the thermosensing element and the resistance of the reference resistor is adjusted by varying the number of counts in a counter upon whose content the timing of the second count depends. Accordingly, the absolute value precision adjustment of the electronic thermometer is realized by providing an initial logic adjustment circuit in which the number of the first clock counts is appropriately varied.

It is a feature of the invention, therefore, that the difference between the resistance of a thermosensing element and a reference resistor in an electronic thermometer is corrected by varying a count number in a first counter to realize an absolute value adjustment.

It is another feature of the invention, that the difference in the resistance of a thermosensing element and that of a reference resistor is offset by setting the number of required bits in as a logic adjustment.

In accordance with still another feature of the invention, the adjustment of the absolute value is performed in one cycle of the clock count value, so that an adjustment of extreme precision is realized.

It is an object, therefore, of the present invention to reduce the cost of making an electronic thermometer by eliminating the variable resistor heretofore required in making an absolute value adjustment.

It is a further object of the invention to reduce the time required for making an absolute value adjustment.

It is a still further object of the invention to improve the precision of an electronic thermometer.

It is another object of the invention to provide an electronic thermometer which is proof against mechanical shock.

It is still another object of the invention to favorably enhance the aging characteristic of an electronic thermometer.

It is again another object of the invention to eliminate an element of an electronic thermometer so as to permit reduction of size of the instrument.

It is still a further object of the invention to provide an absolute value adjustment which is not limited in its application to thermometers, such as clinical thermometers, but is also useful with manometers and other measuring devices.

The invention accordingly comprises the features of construction, combinations of elements, and arrangements of parts which will be exemplified in the constructions hereinafter set forth, and the scope of the invention will be indicated in the claims.

BRIEF DESCRIPTION OF THE DRAWINGS

For a further understanding of the invention, reference is had to the following description taken in connection with the accompanying drawings, in which.

DETAILED DESCRIPTION OF THE INVENTION

Figure 1:
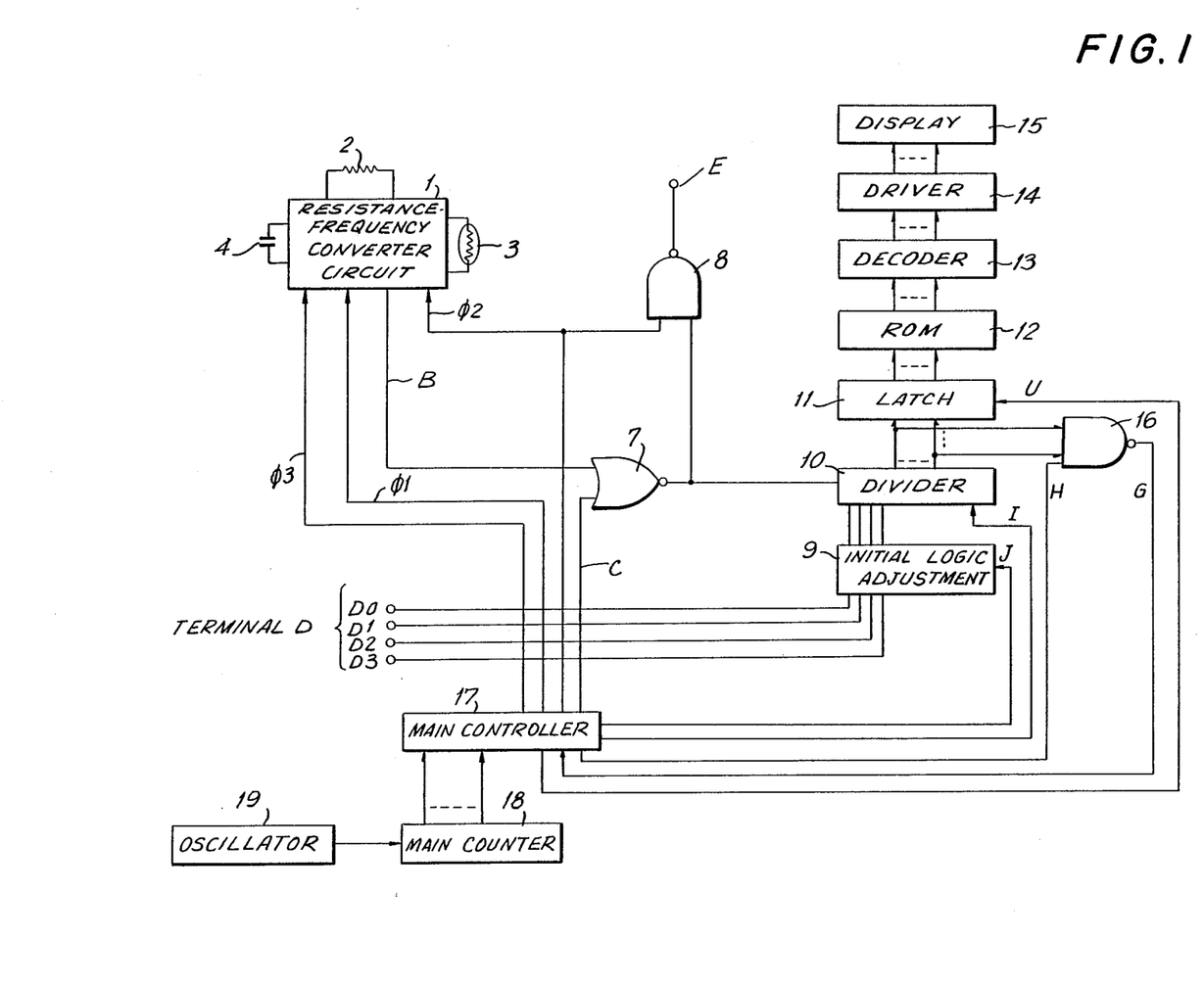
FIG. 1 is a block diagram of an electronic thermometer in accordance with the present invention.
Figure 2:
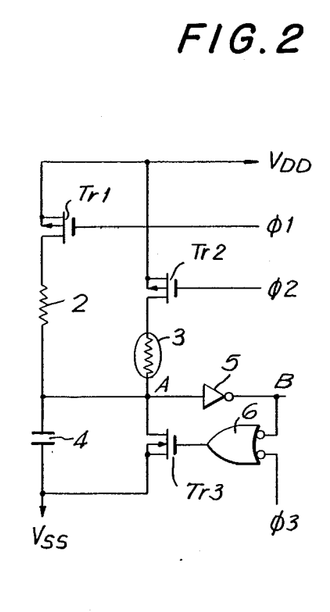
FIG. 2 is a circuit diagram of the resistance-to-frequency converter used in the thermometer of FIG. 1.

Referring to FIGS. 1 and 2, a first embodiment of the invention is depicted to measure temperature, in which a digital count value relating to the temperature is obtained as a function of the number of times that a reference resistor 2 and a capacitor 4 and the number of times that a thermosensing element 3 and the capacitor 4 are each cyclically charged and discharged. The digital count value is latched in latch circuit 11 and is then converted into the digital value of the temperature by means of a conversion table stored in ROM (read-only-memory) 12. The temperature can then be seen on display 15.

As can be seen in FIG. 1, clock signals generated by oscillator 19 are divided in main counter 18, the divided clock pulses being fed to main controller 17. Main controller 17, in turn, feeds controls signals Φ1, Φ2, and Φ3 as gate control signals to MOS transistors Tr1, Tr2, and Tr3, respectively (FIG. 2), for effecting the cyclic charging and discharging of capacitor 4, alternatively via reference resistor 2 and thermosensing element 3. Transistors Tr1 and Tr2 are P-channel transistors and transistor Tr3 is an N-channel transistor. A digital value relating to measured temperature is a function of the number of cycles of capacitor 4 which are counted during a predetermined interval and stored in latch circuit 11. The stored value is converted into a corresponding digital temperature value by a conversion table stored in ROM (read-only-memory) 12 and the result is displayed in display 15. The charging and discharging periods of reference resistor 2 and capacitor 4 and of thermosensing element 3 and capacitor 4 are defined as Phase I and Phase II (see FIG. 4), respectively, and are used below in explaining FIG. 2.

Figure 4:
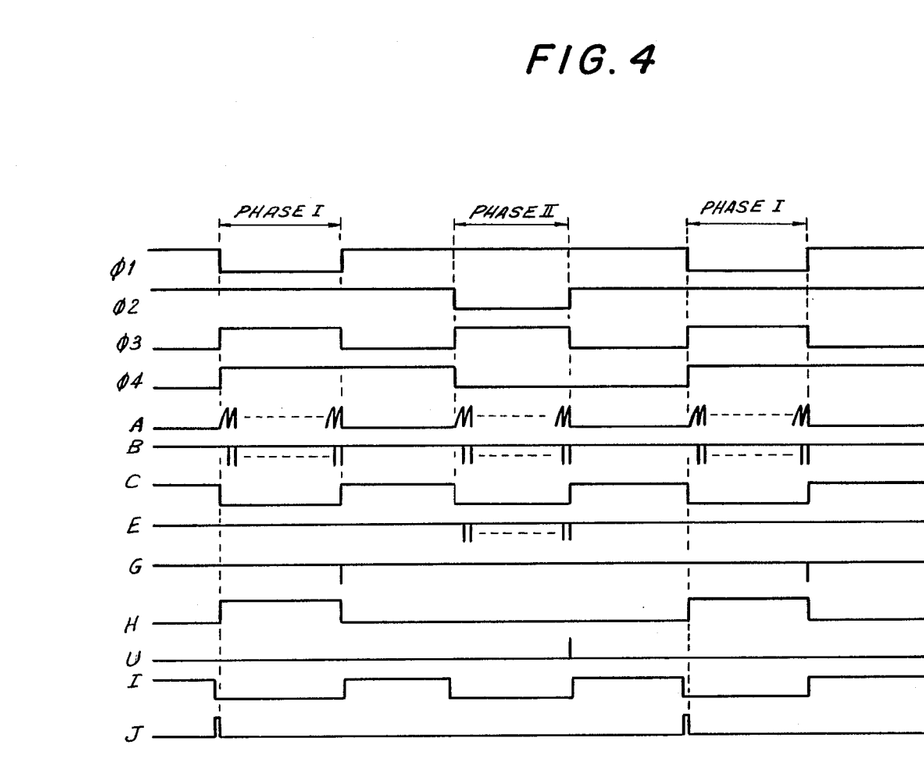
FIG. 4 is a timing diagram showing voltage levels at specified points in the circuit of FIGS. 1, 2, and 3.

(1) The cyclic charging and discharging mode in Phase I

In Phase I, control signals Φ2 and Φ3 are high, as is the starting level on connecting line B; control signal Φ1 is low. P-channel transistor TR1 is switched ON. Given a capacitance C of capacitor 4 and a resistance value R1 of reference resistor 2, capacitor 4 is charged at a rate having the time constant $R_1C$.

The signal which is fed to inverter 5 is inverted when the voltage level at point A exceeds the logic level of $\frac{1}{2}$ VDD and the output is again inverted in NAND gate 6 for input to the gate of N-channel transistor Tr3. Transistor Tr3 immediately turns ON. Consequently, the voltage level at point A is shorted to VSS by N-channel transistor Tr3. The cycle repeats itself, and the resulting waveform is shown in FIG. 4, Phase I, waveform A. The waveform in line B from inverter 5 is shown in waveform B of FIG. 4. Given that Phase I has a period T1, the relation between T1 and the number N1 of pulses of waveform B is expressed by the following formula:

$$T1 = (R1 \cdot C \cdot \ln 2) \cdot N1 \qquad (1).$$

(2) The cyclic charging and discharging mode in Phase II

In Phase II, control signal Φ2 is low, Φ1 and Φ3 are high, and the starting level on line B is high. P-channel transistor Tr2 is turned ON. Accordingly, given a resistance value Rs for thermosensing element 3, capacitor 4 charges with a time constant $R_sC$. In the same way as described in mode (1), when the voltage level at point A reaches the logic level of inverter 5, i.e. $\frac{1}{2}$ VDD, N-channel transistor Tr3 turns ON and the level at point A is shorted to VSS. The cycle repeats itself, and the resulting waveform is shown in waveform A of FIG. 4, in Phase II. The waveform in line B, after modification by passing through inverter 5, is shown in Phase II of waveform B of FIG. 4.

Given the period of Phase II as T2, the relation between T2 and the number N2 of pulses of waveform B is expressed by the following formula:

$$T2 = (Rs \cdot C \cdot \ln 2) \cdot N2 \qquad (2).$$

Period T1 starts at the rise of output Φ4 (transmitted internally and not shown in FIG. 1 of the divider stage of main counter 18. At the same time, outputs Φ1 and Φ3 from main controller 17 rises. At this time, cyclic charging and discharging of reference resistor 2 and capacitor 4 begins. In response to the fall of the signal on line C from controller 17, pulsed waveform B is applied, via NOR gate 7, as a clock signal to the input of divider network 10. The cyclic charging and discharging of capacitor 4 via reference resistor 2 continues, and, when the pulse count value at the output of divider 10 reaches and coincides with the number N1 of pulses in Phase I mentioned above, multiple-input NAND gate 16 outputs the pulse signal G. In response to signal G which is feed back to main controller 17, signal Φ1 rises and signal Φ3 falls and the signal on line C rises, terminating Phase I. At this time, main controller 17 stores the length of period T1, using the divided output of main counter 18.

During period T1 in Phase I, the level of signal H which is fed from main controller 17 to NAND gate 16 is high.

Period T2 starts when output Φ4 from the designated divider stage of the main counter 18 falls. Then, output signal Φ2 falls and Φ3 from the main controller 17 rises, at which time the cyclic charging and discharging of capacitor 4 via thermosensing element 3 is commenced. In response to the fall of signal C, pulsed waveform B is applied to divider 10 as the clock signal. As the cyclic charging and discharging of thermosensing element 3 and capacitor 4 continues, main counter 18 continues to count up. In main controller 17, the divided output data of period T1 (stored therein in Phase I) is compared at this time with the counted data from main counter 18. When the divided output data of the period T1 and the new counted data coincide, output Φ2 rises and output Φ3 from main controller 17 falls and signal C from main controller 17 rises, terminating the input to divider 10, ending period T2. At the same time, in order to latch the aforementioned number of pulses N2 in latch circuit 11, main controller 17 outputs latch signal U.

As described above, the operation of main controller 17 is such as to make periods T1 and T2 equal in length. Accordingly, equations (1) and (2) can be set equal:

$$(R1 \cdot C \cdot \ln 2) \cdot N1 = (Rs \cdot C \cdot \ln 2) \cdot N2 \qquad (3)$$

then:

$$N2 = N1 \cdot R1/Rs \qquad (4).$$

Thus, N1, N2, and Rs, R1 are in a proportional relationship.

When a thermistor is used as the thermosensing element, the resistance value Rs at the temperature T° C. is expressed by the following formula:

$$Rs = R_o \text{EXP } B \, (1/T - 1/T_o) \qquad (5)$$

in which B is the thermistor's constant, $T_o$ is the reference temperature and $R_o$ is the thermistor's resistance at $T_o$.

When equation (5) is substituted in equation (4), the following is obtained:

$$N2 = N1 \cdot R1/R_o \text{EXP } B \, (1/T - 1/T_o) \qquad (6).$$

Thus, the count value N2 at the temperature T° C. can be calculated.

The count value N2 is transmitted to ROM 12 from latch circuit 11 and converted to the digital value of the temperature in centigrade (°C.) or in Fahrenheit (°F.)

by means of the conversion table which is stored therein and which is based on equation (6).

In the above resistance-to-frequency conversion, the reverse case is also possible. Thus the cyclic charging and discharging of the capacitor via the thermosensing element is first performed in Phase I and the cyclic charging and discharging of the capacitor via the reference resistor is performed in Phase II. Now the cyclic charging and discharging of the capacitor via the reference resistor is expressed by N2 and is converted to the digital temperature value, because N1, N2, Rs, R1 are in a proportional relation.

In order to adjust the absolute value of the resistance, the number N2 of pulses in waveform B (i.e., the count value of the cyclic charging and discharging of the capacitor via the thermosensing element) is adjusted by the predetermined number. Thus, it is required to correct the error in N2 which is caused by variation in the ratio of reference resistor 2 to thermosensing element 3 from the predetermined resistance ratio which results from the difference between the resistances of reference resistor 2 and thermosensing element 3. Given an aberration K of the real resistance ratio relative to the predetermined resistance ratio, equation (4) can be expressed as follows:

$$N2 = K \cdot N1 \cdot R1/Rs \quad (7).$$

Herein, K is to be corrected in any way.

Hence, by making N1 a variable, which is expressed by $N|$ and by substituting $N1 = N\,\|\,/K$, equation (7) can be transformed as follows:

$$N2 = K(N\,\|\,/K)R1/Rs$$

$$N2 = N\,\|\, \cdot R1/Rs \quad (8).$$

Thus, the aberration K from the predetermined resistance ratio can be corrected when N1 is defined by the variable $N\,\|\,/K$ and, consequently, the absolute value adjustment is realized. In this first embodiment of the invention, N1 is varied as described above, by means of an initial adjustment logic circuit.

In general, the circuit of FIGS. 1 and 2 is designed so that $N\,\|\,$ is the difference between the count of the divider 10 which triggers multiple-input NAND gate 16 and a predetermined initial data set which is supplied by initial logic adjustment circuit 9. If M is the output resulting from signal G of multiple-input gate 16 and Mφ is the predetermined value of the initial data set, $N\,\|\,$ is expressed by:

$$N\,\|\, = M - M\phi.$$

In this embodiment, M is fixed and Mφ is varied to make $N\,\|\,$ variable.

The method for varying Mφ is as follows:

For example, to set Mφ=1, the connection between D₀ of logic adjustment data input terminal D (hereinafter referred to as "terminal D") and VSS line 33 (FIG. 3) is opened, for example, by cutting the pattern line on the substrate, so that input D₀ of ½-bit flip-flop 20 is pulled up, outputting the data read-in signal. In dependence on the timing of signal J from main controller 17, NAND gate 24 turns ON, setting the 2⁰ output of set-priority-resettable-½ divider (hereinafter, set-½ divider) 28, making Mφ=1.

Figure 3:
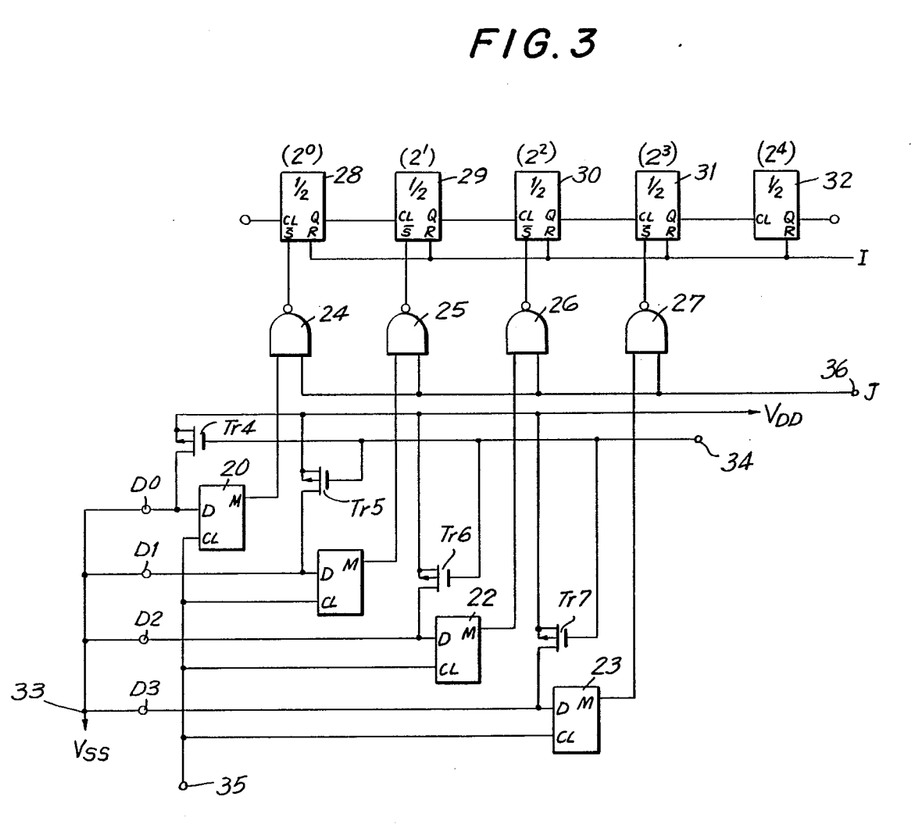
FIG. 3 is a circuit diagram of a portion of the block diagram of FIG. 1, showing an initial logic adjustment circuit and a divider.

To set Mφ=5, both the pattern line between D₀ of flip-flop 20 terminal D and VSS line 33 and the pattern line between D₂ of flip-flop 22 terminal D and VSS line 33 are opened. Accordingly, the 2² output of set-½ divider 30 as well as the 2⁰ output of divider 28 are set and Mφ becomes 5.

If any pattern line between terminal D and VSS line 33 is not opened, the output of the set-½ divider which corresponds to that line is not set.

If P-channel transistors Tr4 to Tr7 (FIG. 3) were to be left ON, current would flow between VDD and VSS and the consumption of power by the circuit would be substantial. The circuit is therefore arranged so that the initial data is read in at an appropriate time in the cycle by means of a low-level signal supplied to gate terminal 34 which turns P-channel transistors Tr4 to Tr7 ON. Now, when a data read-in signal is input to clock terminal 35, the data is read into ½-bit flip-flop circuits 20 to 23 and is held there until the following data read-in cycle.

In FIG. 3, gates 24, 25, 26, 27 are NAND gates, dividers 28 to 31 are set-½ dividers, and divider 32 is a resettable-½ divider.

As shown in FIG. 4, the timing of providing the initial data is such that, after all dividers in divider 10 have been reset by reset signal I prior to the beginning of Phase I, the logic adjustment data, i.e. the initial data, is read in to the divider network 10 in response to data read-in signal J on terminal 36.

As described above, the predetermined value of the initial data set is defined by inputting the logic adjustment data by opening or not opening the substrate pattern lines D₀ to D₃ of terminal D. In this way, the count N1 which results from the charging and discharging of capacitor 4 via reference resistor 2 during period T1 (Phase I) is varied and the aberration of the resistance ratio due to the difference between the resistance of the thermosensing element and that of the reference resistor at the time of the adjustment is corrected. The absolute value adjustment is thus realized.

Figure 5:
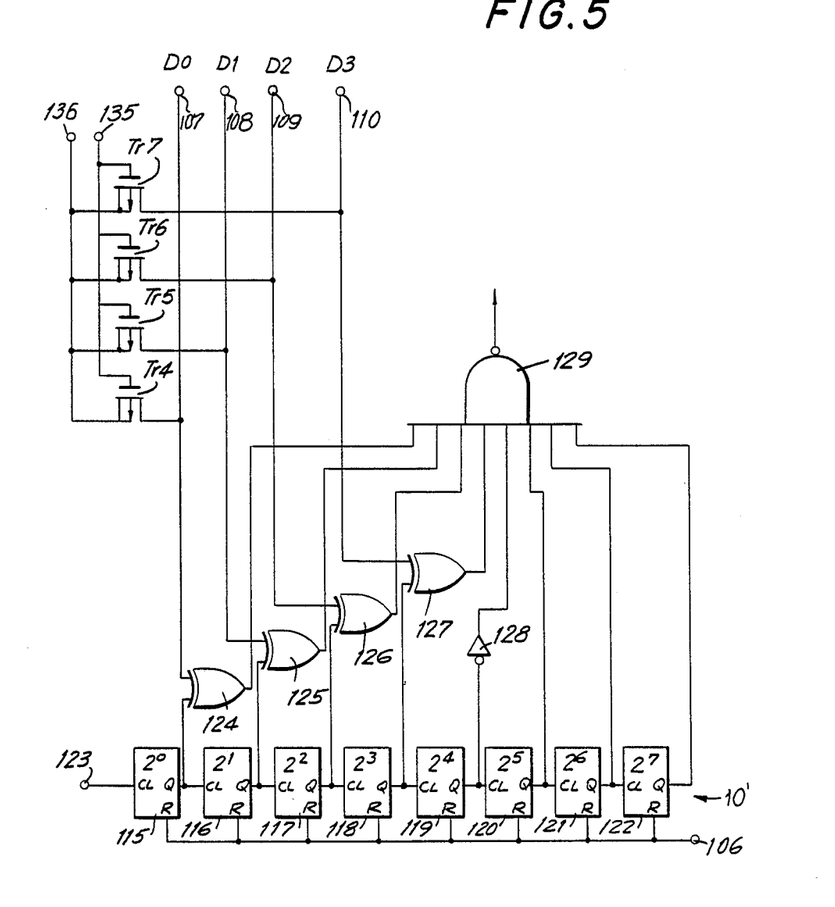
FIG. 5 is a circuit diagram of a second embodiment of an initial logic adjustment circuit.

Reference is now made to FIG. 5 in which another illustrative embodiment of an initial logic adjustment circuit 9 useful in the circuit of FIG. 1 is depicted. Here, the reference resistance is converted to frequency, a predetermined number of cycles as determined by the output of multipleinput NAND gate 129. The output signal of gate 129 acts in the same way as gate 16, terminating the charge/discharge cycle in Phase I when the pulse number N1 in Phase I reaches a fixed value. Then the resistance of the thermistor is converted to frequency for the time defined by main counter 18 and main controller 17, which is equal to the time for the referenceresistance-to-frequency conversions. The resulting count value of the resistance-to-frequency conversion of the thermistor resistance is held in latch circuit 11. The output of latch circuit 11 is decoded by decoder 13 for display in display 15.

Since the resistance-to-frequency conversions of the reference resistance and of the thermistor resistance are performed in a fixed period of time, and since the resistance value with respect to the conversions is in inverse proportion to the number of conversions, the conversion of the count value of resistance R1 to the count value of the thermistor temperature is expressed by the following equation:

$$R1 \cdot L = Rs \cdot N \quad (10)$$

where L is the predetermined number of count values of the reference resistance-to-frequency conversion, N is the predetermined number of thermistor resistance-to-frequency conversions, R1 is the value of the reference resistance, and Rs is the value of the thermistor resistance.

In initial adjustment, the predetermined count value N of the thermistor resistance-to-frequency conversion is adjusted to the number of adjustments of the temperature at the time of adjustment. So, by transforming equation (10), N is:

$$N = L \cdot R1/Rs. \tag{11}$$

Accordingly, the variation of the ratio of R1/Rs is corrected by L.

In the present embodiment, the count value triggered by the output of multiple-input NAND gate 129 is W, and W corresponds to L. The value W can be varied according to the states of the initial logic adjustment data input lines (hereinafter data line) D$\phi$, D1, D2, D3 which are applied to the respective inputs 107, 108, 109, and 110 of EXOR (exclusive-OR) gates 124, 125, 126, and 127. Provision is thus made for varying the value L of equation (11), enabling the logic adjustment.

The above principle is explained by means of concrete figures. Given the respective resistances of the thermistor and of the reference resistance at a temperature at the time of adjustment as 23.0k and 22.4k, in order to adjust the count value N of the resistance-to-frequency conversions with respect to the resistance of the thermistor of 224 counts, L is obtained by substituting each value in equation (11) as follows:

$$\begin{aligned} 224 &= L \cdot 22.4/23.0; \\ L &= 230 \end{aligned} \tag{12}$$

Accordingly, in this example, the initial adjustment is realized by setting W=230 counts.

If the output of each ½ divider is VDD, each of the dividing numbers can be predetermined (for example, $2^0$ for the $2^0$ presettable ½ divider, $2^1$ for the $2^1$ resettable divider), and W is realized as follows:

$$\begin{aligned} W &= 230 \\ &= 128 + 64 + 32 + 4 + 2 \\ &= 2^7 + 2^6 + 2^5 + 2^2 + 2^1 \end{aligned}$$

Thus, to pre-set W as 230, multiple-input NAND gate 129 is designed to output when outputs of $2^7$, $2^6$, $2^5$, $2^2$, $2^1$, respectively, of the resettable-½ dividers are VDD, and the outputs of the $2^4$, $2^3$, $2^0$, respectively, of the resettable-½ dividers are VSS.

In order to cause multiple-input NAND gate 129 to output, the following conditions are to be taken in account:

(1) Multi-input NAND gate 129 outputs VSS when all inputs thereto are VDD.

(2) When inputs from one of the data lines to EXOR gates 124-127 is VDD, the output of the resettable-½ divider of divider network 10' is inverted by the EXOR gates 124-127 and the inverted output is input to multipleinput NAND gate 129.

(3) When an input from a data line to an EXOR is VSS, the output of the resettable-½ divider is passed through the EXOR and is input to multiple-input NAND gate 129.

Considering the above points, the circuit is designed so that EXORs 125 and 126 pass the outputs of the resettable-½ dividers to multiple-input NAND gate 129 without inversion, and EXORs 124 and 127 invert the outputs from the resettable-½ dividers and feed the inverted output to the respective inputs of multiple-input NAND gate 129. Accordingly, by causing data lines D1, D2 to be VSS and data lines D$\phi$, D4 to be VDD, W is set at 230, and the initial adjustment of the logic is realized.

By properly choosing the number of ½ divider stages, the number of signal input lines, and the output of the multiple-input gate, the precise adjustment of the thermistor of any property which is used as the thermosensing element can be performed in accordance with this invention.

Referring again to FIG. 1, when output signal E of NAND gate 8 is detected by an external measuring device whose measuring timing is synchronized therewith, the count N2 which is related to the measured temperature can be detected and the aberration of the resistance ratio of the thermosensing element and the reference resistor before adjustment can be detected by conversion of N2.

Thus, if an external CPU is provided for storing the correction for aberration of the resistance ratio for N2 conversion, that is, if the logic adjustment data is provided and if the logic adjustment data correct is performed by the external CPU using the value of N2 detected as above, the correction can be completed in one step.

In addition, an easy, precise test of temperature measurement by an electronic thermometer can be realized by means of signal E.

Figure 6:
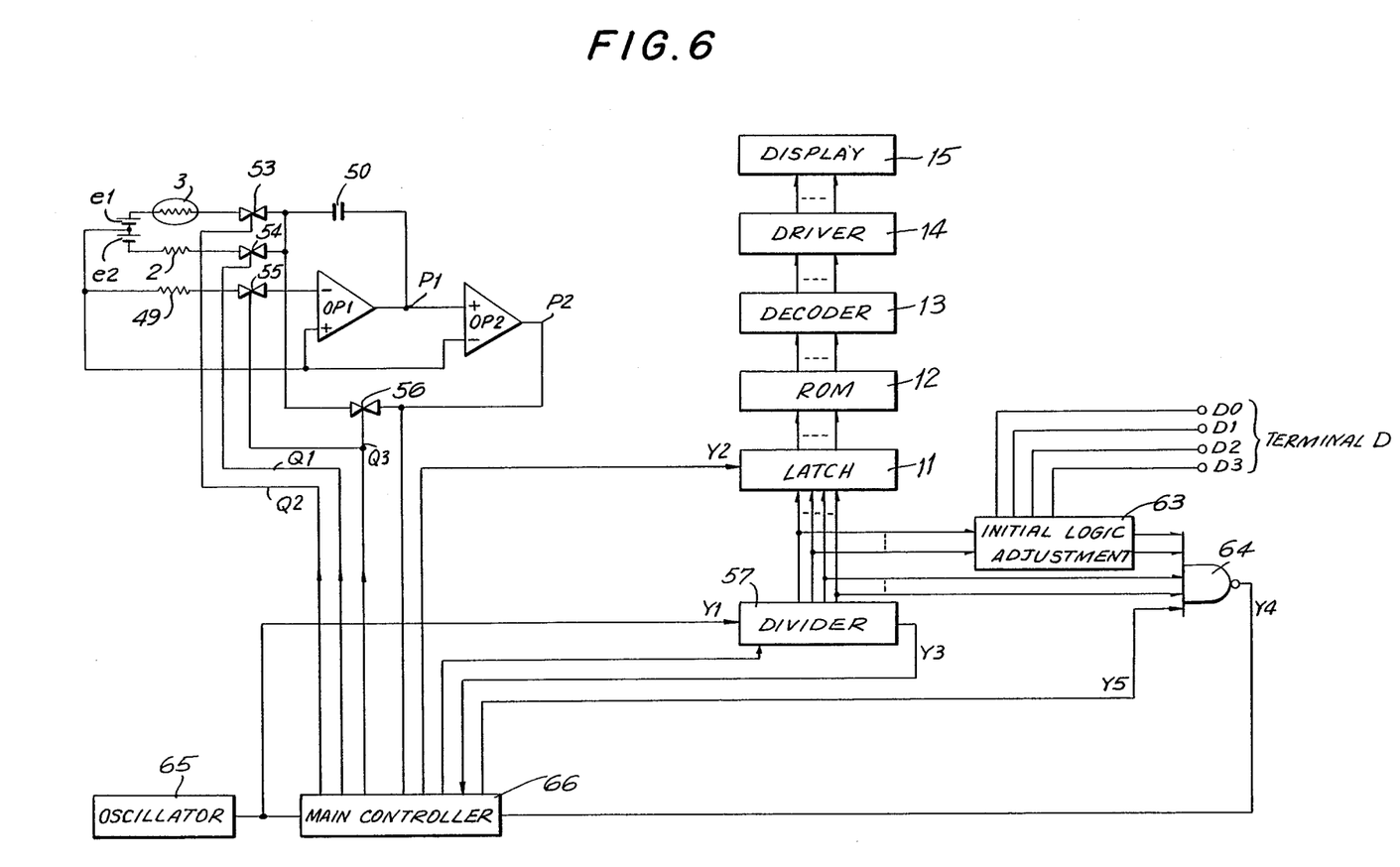
FIG. 6 is a block diagram of a second electronic thermometer in accordance with the invention.
Figure 7:
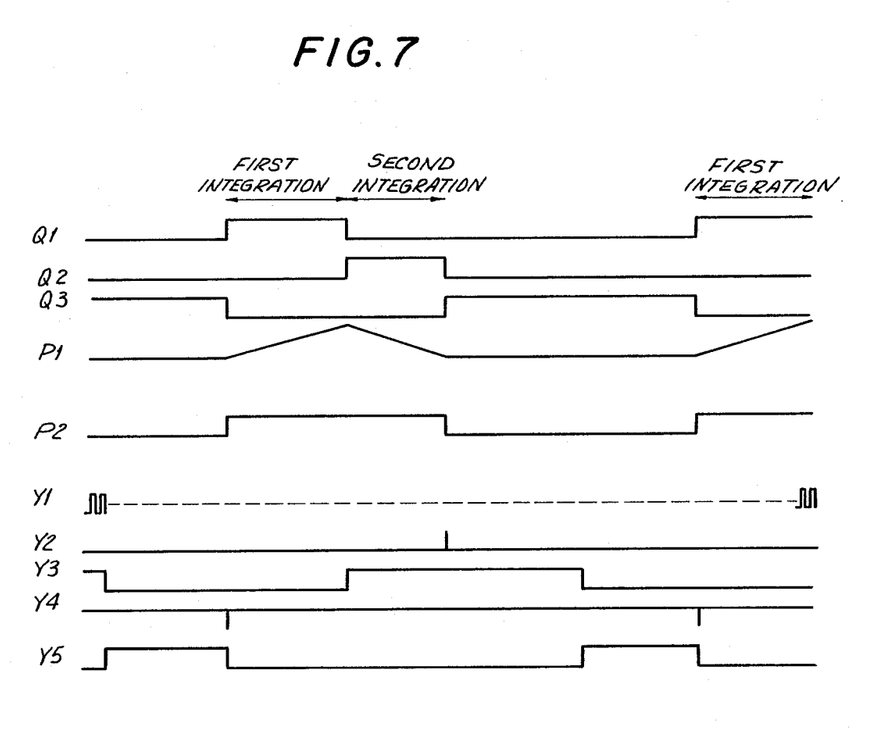
FIG. 7 is a timing chart showing levels of the signals appearing in the circuit of FIG. 6 at the points specified.

In comparison with the embodiment of the invention described above, where a resistance-to-frequency converter circuit is used in the input, another embodiment of the invention uses a double-integrating connection, with analog-to-digital conversion, as the input. This embodiment is illustrated in FIGS. 6 and 7.

The principle used in temperature measurement in the second embodiment is that the ratio of the time required for integrating a predetermined constant voltage which is fed to thermosensing element 3 and capacitor 50 and the time required for integrating the same voltage, fed to reference resistor 2 and capacitor 50, is converted to a digital value and then converted into temperature for display.

The periods for integration by reference resistor 2 and capacitor 50 and by thermosensing resistor 3 and capacitor 50 are referred to as the first integration period and the second integration period, respectively. Each of these is explained below.

(3) The First Integration

Clock signal Y1 is fed from oscillator 65 to divider 57, which repeatedly counts from 0 to the count-up. When the output of divider 57 matches the predetermined input to multiple-input gate 64, and enabling signal Y5 is received, multiple-input gate 64 acting in a manner similar to gate 16 in the previously discussed embodiment, which has been enabled by signal Y5 from controller 66, outputs a signal Y4, which is fed to main controller 66. In response, main controller 66 outputs high-level signal Q1 to analog switch 54. Switch 54 turns ON and begins the integration via reference resistor 2. The integration ends with the count-up of divider 57.

In the first integration, the variation of output voltage P1 of operational amplifier OP1 is expressed by:

$$\Delta VP1 = N1 \cdot E2 / R1 \tag{13}$$

in which $\Delta VP1$ is the amount of variation of voltage P1, E2 is the voltage applied to reference resistor 2 by reference voltage source e2, and N1 is the number of clock signals applied to divider 57 by oscillator 65 during the first integration period.

(4) The Second Integration

When the first integration is complete, output signals Q1 and Q2 of main controller 66 become low and high, respectively, turning off analog switch 54 and turning on analog switch 53. This starts the second integration. Integration continues and, when the output voltage of operation amplifier OP1 comes to the level it had before the first integration began, operational amplifier OP2 inverts the input signal and output signal P2 goes low. Signal P2 is fed to main controller 66 which puts signal Q2 at low level, terminating the second integration. The count N2 of the clock signals is held in latch 11.

The variation of output voltage P1 of operational amplifier OP1 during the period of the second integration is expressed by:

$$\Delta VP1 = E1 / Rs \cdot N2 \tag{14}$$

in which E1 is the voltage applied to thermosensing element 3 by reference voltage source e1, and N2 is the number of clock signals counted by divider 57 during the second integration.

Since the absolute value of $\Delta VP1$ in the equations (13) and (14) are equal, the following equation is obtained:

$$N1 \cdot E2 / R1 \cdot N2 \cdot E1 / Rs \tag{15}$$

If the circuit is designed so that E1 and E2 are equal, the following equation is obtained:

$$N1/R1 = N2/Rs \tag{16}$$

Accordingly, $$N2 = Rs/R1 \cdot N1 \tag{17}$$

Equation (17) is the same as equation (4) in the description of the first embodiment, except that now Rs/R1 is the reciprocal of the R1/Rs in (4). Consequently, and similarly to the first described embodiment, the difference in the resistance ratios of the thermosensing element and the reference resistor can be corrected by varying N1 to realize the absolute value adjustment.

In this embodiment, the phase (value) of the output signal from the divider 57 is varied in accordance with the logic adjustment data (the predetermined initial data set), causing the output of multiple-input gate 64 to vary by using as the initial logic adjustment circuit 63, the circuit of FIG. 5. Here N1 is obtained by:

$$N1 = N\phi - NG \tag{18}$$

in which $N\phi$ is the number counted by the divider 57 from zero to the count-up and NG is the predetermined value of the output set into multiple-input gate 64 by initial logic adjustment circuit 63. Accordingly, N1 can be varied by varying NG.

In FIG. 6, the initial logic adjustment circuit is numbered 63 and resistor 49 is provided for automatically returning P1, P2 to zero when connected by switch 55 in response to signal Q3 which goes high at the same time that main controller 66 resets divider network 57. Elements 53, 54, 55, and 56 are analog switches.

The present invention is applicable to any electronic thermometer, no matter what kind of A-D converter is used in the input portion of the circuit, so long as the electronic thermometer uses a system in which a ratio of the resistances of the thermosensing element and the reference resistor is converted to the digital value of the temperature.

Further, in accordance with this invention, by properly arranging the number of bits in the logic adjustment data along with the number of stages of $\frac{1}{2}$ dividers and the output of the multiple-input gate, the difference in resistance between any thermosensing element and reference resistor can be corrected. Since the adjustment is done in one count of the clock, an adjustment of extreme precision can be realized.

Moreover, in accordance with the invention, the divider or the main counter is used as a ring counter for counting from count $\phi$ to count-up. Since the ring counter provides a constant measurement cycle regardless of the result of a measurement, an external CPU can easily be connected to the device.

Also, by a further division of the round cycle, the time for sounding a buzzer or for automatic power-off can be set. Thus, the number of $\frac{1}{2}$ dividers required to obtain a round cycle is reduced.

Further, the special divider network can be used instead of the ring counter.

Still further, it is also within the scope of our invention for the main counter, the main controller circuit, the initial adjustment logic circuit, the divider circuits, the multiple-input gates, the latch circuits, the ROM, the decoder, the driver circuit, etc., to be replaced by a one-chip or a two-chip CPU, as appropriate. When a CPU is used with the invention, a fusible ROM or a programmable ROM can be used for storage of the logic adjustment data.

It will thus be seen that the objects set forth above, among those made apparent from the preceding description, are efficiently attained and, since certain changes may be made in the above construction without departing from the spirit and scope of the invention, it is intended that all matter contained in the above description or shown in the accompanying drawings shall be interpreted as illustrative and not in a limiting sense.

What is claimed is:

1. An electronic measuring device comprising:
   sensing means having a physical property which varies in response to a quantity to be measured;
   reference means having a physical property like that of the sensing means but which is substantially invariant in response to variations of the quantity being measured;
   permanently programmable storage means for providing a predetermined initial logic adjustment value which represents the difference between the absolute values of the sensing means and the reference means;
   converter means for measuring the reference means during a first measurement period to provide a reference count value and for measuring the sensing means during a second measurement period to provide a sensing count value, each count value being proportional to the respective measurements;
   comparing means having the initial logic adjustment value, the reference count value, and the sensing count value as inputs, the comparing means providing a signal when the sum of the reference count and the initial logic adjustment value attains a predetermined value and a corrected sensing count value as an output at the end of the second measuring period;

controller means responsive to the signal from the comparing means for establishing the length of the second measuring period; and means for changing the corrected sensing count value into a digital value for display of the measured quantity.

2. An electronic device in accordance with claim 1, wherein the comparing means further comprises coincidence detecting means having the adjusted reference count value as an input and the coincidence detecting means initiating measurement of the sensing means when the adjusted reference count reaches a predetermined level.

3. An electronic measuring device in accordance with claim 2 in which the measured quantity is temperature, the reference means comprises a reference resistor, and the sensing means comprises a thermosensing element.

4. An electronic measuring device in accordance with claim 2 in which the comparing means comprises a resettable-½ divider into which the initial logic adjustment value is set.

5. An electronic measuring device in accordance with claim 2 in which the comparing means comprises a counter having a low bit portion which comprises a set-priority resettable-½ divider and having a high bit portion which comprises a resettable-½ divider, and a multiple input gate having the data in the dividers and the initial logic adjustment value as inputs.

6. An electronic measuring device in accordance with claim 3 in which the converting means comprises a resistance-to-frequency converter and the comparing means comprises a counter having the output of the resistance-to-frequency converter as an input.

7. An electronic measuring device in accordance with claim 6 in which the comparing means further includes a divider having the first count value and the initial logic adjustment value as inputs, there being a multiple-input NAND gate connected across the divider to detect coincidence and to provide the signal for establishing the length of the second measurement period.

8. An electronic measuring device in accordance with claim 7 in which the resistance-to-frequency converter further comprises a capacitor, the measuring device further comprising:

switching means responsive to at least one control signal for connecting one of the reference resistor and the sensing means to the capacitor for measurement.

9. An electronic measuring device in accordance with claim 7 in which the resistance-to-frequency converter further comprises:

logic means for cyclically charging and discharging the capacitor for a first period through the reference resistor and for a second, equal period, through the sensing means to provide the reference count value and the sensing count value.

10. An electronic measuring device in accordance with claim 8 in which the switching means comprises a switch responsive to a first control signal for connecting the reference resistor to the capacitor and a second switch responsive to a second control signal for connecting the sensing means to the capacitor, the controller means providing the first control signal to the first switch and, when the signal from the comparison means has been received, providing the second control signal to the second switch.

11. The electronic measurement device of claim 3 in which the converting means comprises a double-integration converter and the comparing means comprises a counter, and further comprising:

clock means having a train of clock pulses as an output, the clock signals being input to the counter; and controller means having the clock pulses and the output of the double-integration converter as inputs, the controller means feeding a control signal to the counter when integrating measurement of the reference means is complete, whereby counting of the sensing value is initiated.

12. The electronic measuring device of claim 11 in which the comparing means comprises a multiple-input AND gate having the reference count value as an input and feeding the signal to the controller means to terminate measurement of the reference means.

13. The electronic measuring device of claim 11 in which the controller means outputs at least one switching signal and further comprising:

a capacitor as the integrating element in the double-integrating converter;

switch means responsive to the switching signal for connecting one of the reference means and a predetermine voltage, and the sensing means and the predetermined voltage, to the capacitor as first and second intergrating elements, whereby an operational amplifier means provides one of an integrated reference signal and an integrated sensing signal to the controller means.

14. An electronic measuring device in accordance with claim 3 in which the means for changing the corrected sensing count value into a digital value for display comprises:

latch means for storing the corrected sensing count value;

read-only-memory means for converting the corrected sensing count value into a temperature value;

means for decoding the output of the read-only-memory;

driver means receiving the decoded signal; and display means responsive to the driver means for displaying the measured temperature.

15. An electronic measuring device in accordance with claim 3 wherein the means for changing the corrected sensing count value into a digital value for display comprises:

latch means for storing the corrected sensing count value;

read-only-memory means for converting the stored corrected sensing count value into a value representative of the quantity measured;

driver means having the converted value of the read-only-memory means as an input; and display means responsive to the output of the driver means to display the measured temperature.

16. An electronic measuring device in accordance with claim 3 wherein the means for changing the corrected sensing count value into a digital value for display further comprises:

latch means having the corrected sensing count value as an input;

decoder means having the value latched in the latch means as an input;

driver means having the decoded signal from the decoder means as an input; and display means responsive to the output of the driver circuit to display the measured temperature.

17. An electronic measuring device in accordance with claim 3 and further comprising:

means responsive to a control signal for making a measured value available for independent measurement.

18. An electronic measuring device in accordance with claim 3 in which the converter means comprises a resistance-to-frequency converter.

19. An electronic measuring device in accordance with claim 3 in which the converter means comprises a double-integration converter.

20. An electronic measuring device comprising:

thermosensing means having a resistance which varies in response to a temperature to be measured;

reference resistor means having a resistance which is substantially invariant;

resistance-to-frequency converter means for measuring the reference resistor means during a predetermined period and the thermosensing means during a sensing period to respectively provide a reference count value and a sensing count value, each count value being proportional to the respective measurements;

divider means having the reference count value and the sensing count value as inputs and having a corrected sensing count value as an output;

means coupled to the divider means for correcting the reference count value by the addition thereto of a predetermined initial logic adjustment value which represents the difference between the absolute values of the thermosensing means and the reference means so as to provide a corrected reference count value;

multiple-input NAND gate means responsive to the corrected reference count value to establish the length of the sensing period; and means for changing the output of the divider means into a digital value for display of the measured quantity.

21. An electronic measuring device in accordance with claim 20 in which the resistance-to-frequency converter further comprises a capacitor, the measuring device further comprising:

switching means responsive to at least one control signal for connecting one of the reference resistor means and the thermosensing means to the capacitor for measurement.

22. An electronic measuring device in accordance with claim 21 in which the resistance-to-frequency converter further comprises:

logic means for cyclically charging and discharging the capacitor through a reference resistor means during the predetermined period and through the thermosensing means during the sensing period to respectively provide the reference count value and the sensing count value.

23. An electronic measuring device in accordance with claim 22 in which the NAND gate means provides a sensing period control signal and in which the switching means comprises a switch responsive to a first control signal for connecting the reference resistor to the capacitor and a second switch responsive to a second control signal for connecting the thermosensing means to the capacitor and further comprising:

controller means having the sensing period control signal as an input, the controller means providing the first control signal to the first switch and, when the sensing period control signal is received, providing the second control signal to the second switch.

* * * * *